(12) United States Patent
Kashiwakura

(10) Patent No.: US 9,380,704 B2
(45) Date of Patent: *Jun. 28, 2016

(54) TRANSMISSION SYSTEM AND METHOD FOR CONSTRUCTING BACKPLANE SYSTEM

(75) Inventor: Kazuhiro Kashiwakura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 354 days.

This patent is subject to a terminal disclaimer.

(21) Appl. No.: 14/008,575

(22) PCT Filed: Mar. 30, 2012

(86) PCT No.: PCT/JP2012/058556
§ 371 (c)(1),
(2), (4) Date: Sep. 30, 2013

(87) PCT Pub. No.: WO2012/133755
PCT Pub. Date: Oct. 4, 2012

(65) Prior Publication Data
US 2014/0063765 A1  Mar. 6, 2014

(30) Foreign Application Priority Data
Mar. 30, 2011 (JP) ................. 2011-073983

(51) Int. Cl.
*H05K 1/11* (2006.01)
*H05K 1/14* (2006.01)
*H05K 1/18* (2006.01)
(Continued)

(52) U.S. Cl.
CPC .............. *H05K 1/18* (2013.01); *H01R 13/6616* (2013.01); *H01R 13/6625* (2013.01); *H01R 13/6658* (2013.01); *H01R 23/7073* (2013.01); *H04Q 1/15* (2013.01); *H05K 1/0246* (2013.01); *H05K 1/14* (2013.01); *H05K 1/141* (2013.01); *H05K 3/306* (2013.01); *H05K 7/1439* (2013.01); *H04L 25/0298* (2013.01); *H05K 1/0231* (2013.01); *H05K 1/0245* (2013.01); *H05K 1/0251* (2013.01); *H05K 2201/044* (2013.01); *H05K2201/09618* (2013.01); *H05K 2201/10015* (2013.01); *Y10T 29/49128* (2015.01)

(58) Field of Classification Search
CPC ........... H01R 13/6616; H01R 13/6625; H01R 13/6658; H01R 23/7073; H05K 1/141; H05K 1/14; H05K 7/1439
USPC ......... 361/784, 785, 786, 787, 788, 791, 803; 439/620.1, 620.11, 620.12, 620.13, 439/620.15, 620.16, 825, 826
See application file for complete search history.

(56) References Cited

U.S. PATENT DOCUMENTS

| | | | | |
|---|---|---|---|---|
| 5,128,832 A | * | 7/1992 | Lawrence | H05K 1/0231 361/775 |
| 2010/0124848 A1 | * | 5/2010 | Atkinson | H01R 13/719 439/620.09 |

FOREIGN PATENT DOCUMENTS

| | | |
|---|---|---|
| JP | 2002-530001 | 9/2002 |
| JP | 2006-526883 | 11/2006 |

(Continued)

OTHER PUBLICATIONS

International Search Report, PCT/JP2012/058556, Jul. 3, 2012.

*Primary Examiner* — Hoa C Nguyen
*Assistant Examiner* — Binh Tran
(74) *Attorney, Agent, or Firm* — Young & Thompson

(57) ABSTRACT

A through-hole stub AC termination circuit including a resistor and a capacitor, is connected to an open end of a stub of a through-hole provided in a circuit board.

13 Claims, 17 Drawing Sheets

BACKPLANE SYSTEM

(51) Int. Cl.
*H01R 13/66* (2006.01)
*H05K 7/14* (2006.01)
*H01R 12/50* (2011.01)
*H04Q 1/02* (2006.01)
*H05K 1/02* (2006.01)
*H05K 3/30* (2006.01)
*H04L 25/02* (2006.01)

(56) References Cited

FOREIGN PATENT DOCUMENTS

| | | |
|---|---|---|
| JP | 2007-142307 | 6/2007 |
| JP | 2007-317716 | 12/2007 |
| JP | 2009-188272 | 8/2009 |
| JP | 2010-537402 | 12/2010 |

* cited by examiner

BACKPLANE SYSTEM

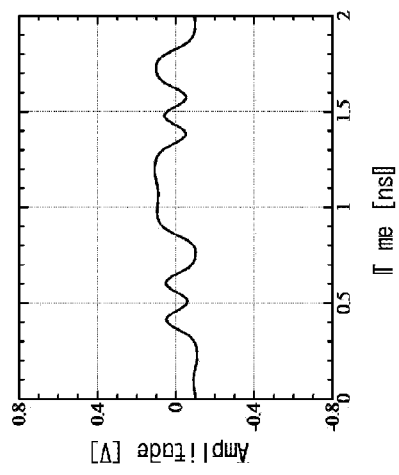
FIG. 15A SEND WAVEFORM
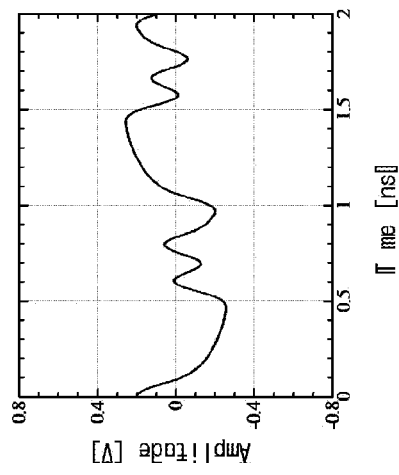
FIG. 15B RECEIVE WAVEFORM
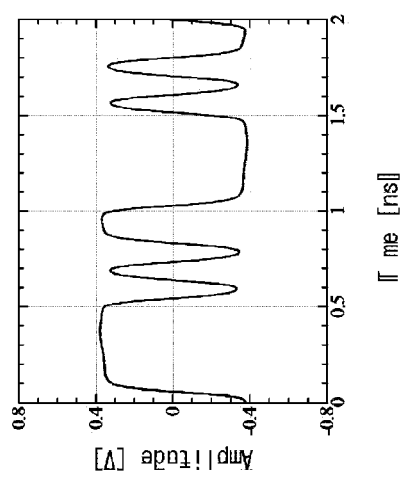
FIG. 15C EQUALIZER TRAVERSING WAVEFORM

TRANSMISSION SYSTEM AND METHOD FOR CONSTRUCTING BACKPLANE SYSTEM

CROSS-REFERENCE TO RELATED APPLICATION

The present application asserts priority rights derived from JP Patent Application 2011-073983 filed in Japan on Mar. 30, 2011. The total contents of disclosure of the Patent Application of the senior filing date are to be incorporated by reference into the present Application. This invention relates to a signal transmission technique. More particularly, it relates to a method for constructing a backplane system, and to a transmission system.

TECHNICAL FIELD

Background

Recently, with spread use of IT (Information Technology) equipments, an amount of information traffic in an information processing apparatus is increasing enormously. Hence, a signal bandwidth in the information processing apparatus is also increasing. A through-hole stub does not exert no effect on a transmission characteristic as long as a signal propagation is propagated at a rate of the order of 1 to 6 Gbps (Gigabits per second). However, when a transmission rate surpasses 10 Gbps, deterioration in the transmission characteristic begins to be markedly noticeable.

Among the related techniques to overcome the deterioration in a characteristic caused by a through-hole stub, there is a technique of through-hole processing by back-drill that cuts a through-hole and a near-by board portion using a drill. The through-hole portion is cut by a drill having a diameter slightly larger than an external shape of the through-hole to bore a hole to remove a through-hole portion corresponding to a stub. However, only few board manufacturers are able to use a back-drill at their disposal. Moreover, the back-drill is of a problem in connection with cost and supply. There is thus a demand for a technique which should take the place of back-drilling. The following describes a typical example of a backplane system as a transmission system.

FIG. 1 is a diagram illustrating an example (prototype) of a backplane system used in a communication equipment, as an example. A backplane is a sort of a printed circuit board, and includes, on its lateral side, a plurality of connectors, also termed backplane connectors. A plurality of cards, mounted on the connectors, are connected to form a bus system. Note that a midplane includes a plurality of connectors (backplane connectors) on both sides of its circuit board. Although in the following description, a backplane structure is described as an example, it is possible to replace the backplane structure with a midplane structure.

Referring to FIG. 1, line cards 11 and a switch card 12 are mounted on connectors of a backplane 14 (backplane connectors 13). The backplane takes charge of electrical connection between the switch card 12 and one of the line cards 11 to perform signal transmission of a line signal via the switch card 12 to the other line card 11. Recently, a line speed transitions from 1 Gbps to 10 Gbps, and is going to evolve further to 40 Gbps or even to 100 Gbps. It is thus necessary to speed up backplane transmission with deterioration of a signal characteristic being suppressed, as shown in FIG. 1.

FIGS. 2A and 2B illustrate a configuration (physical specifications) of the backplane system shown in FIG. 1. FIG. 2A is a diagram schematically illustrating a lateral cross-sectional view of the backplane, connectors and the cards (boards). FIG. 2B is a diagram schematically illustrating sectional view of areas encircled by dotted-line circles of the board and the backplane of FIG. 2A, and illustrates a through-hole and a stub.

Referring to FIG. 2A, a line signal is coupled on a path including an IC (Integrated Circuit) 22A→a board 21A (a small-sized printed circuit board mounted on the backplane, also termed a 'daughter card' or 'a daughter board')→a connector 23A→a backplane 24→a connector 23B→a board (daughter card) 21B→an IC 22B. The connector 23A (23B) includes a terminal (connector terminal) inserted (press-fit) into a through-hole of a board (daughter card) 21A (21B) and another terminal (connector terminal) inserted (press-fit) into a through-hole of the board of the backplane 24.

FIG. 2B schematically illustrates a cross-section of a multilayer board. A signal wiring (interconnect) is coupled to a signal layer (signal) at a preset depth (the depth corresponding to a depth of the signal layer from the board surface) from a through-hole surface coated with an electrically conductive member such as plating to establish electrical conduction. That is, an electrical signal fed to the signal layer (signal), is supplied from an upper part of the through-hole to enter into the signal layer (signal) near at a midpoint of the through-hole, as shown in FIG. 2B. Since the through-hole extends to underneath the portion at which the signal layer (signal) is connected to the through-hole, the portion at which the signal layer (signal) is connected to the through-hole (a bending portion of the signal wiring in FIG. 2B) becomes a branch point of signal path. Hence, the signal propagated from the upper part of the through-hole is propagated at the branch point (bending portion) into the signal layer (signal) in the multilayer board. However, part of the signal propagated from the upper part of the through-hole proceeds from the branch point further downward through the through-hole. The part of the through-hole underneath the branch point, though in itself not being a signal path, is electrically conductive and hence becomes a signal propagation path. In the case where a signal path is branched at a branch point in this manner, the part which is not in itself a signal path is generally termed a "stub" (stub: branch wiring). The signal proceeding from the branch point downward through the through-hole is reflected back at a bottom end portion of the through-hole and proceeds upwards through the through-hole to return to the branch point. There are times when the signal proceeding downwards from the branch point collides against the signal reflected back from the bottom end portion of the through-hole to affect adversely a transmission characteristic of the signal. The effect is outstanding in a high frequency signal, a high speed digital signal and the like. In FIG. 2B, on a lower-side ground plane (power supply) area surrounding differential via (via-hole), there is formed an opening (clearance) freed of the ground plane (power supply), and is termed an anti-pad.

FIG. 3 is a diagram illustrating an example of a connection configuration between a connector (backplane connector 33) and a board (daughter card) and between the connector (backplane connector 33) and a backplane. As the backplane connector 33, a press-fit connector in which its connector terminals 35 are press-fit into corresponding through-holes 34 formed in the board 3, may be used but not limited thereto.

FIG. 4 is a diagram illustrating a signal propagation through a connection portion between the connector (backplane connector) of FIG. 3 and a board (a daughter card or a backplane). A board 41 of the daughter card or the backplane is a multilayer board including a power supply layer or a GND layer (ground layer or ground plane) 42, a signal layer 44 and a dielectric material 43 between the respective layers. The signal layer 44 is provided between GND layers 42, for example. Referring to FIG. 4, a signal from a connector terminal 45 (corresponding to the connector terminal 35 of the backplane connector 33 of FIG. 3) at a top end portion of a through-hole 46, is propagated into the signal layer 44 at a branch point of the signal layer. However, part of the signal flows, within the terminal 45, from the branch point to a downward portion of the through-hole 46 to be reflected back at the bottom end of the through-hole 46. The so reflected signal part collides, at the branch point to the signal layer 44, against the signal proceeding via the upper part of the connector terminal 45. That is, the reflected wave encounters further reflection at the branch point within the through-hole where there occurs multi-reflection. The end part of the connector terminal 45 in the through-hole 46 is open and hence the signal undergoes total reflection. The branch point in the through-hole 46 (point of connection to the signal layer 44) is at a low impedance, and hence the signal is reflected with phase inversion. As a consequence, there results a quarter-wavelength resonance by a standing wave having the end part of the connector terminal as an anti-node and the branch point in the through-hole as a node.

With a stub length L (in FIG. 4, a length between the coupling part of the signal layer 44 to the through-hole 46 and the lower end of the through-hole), the wavelength γ of the standing wave is given by the following equation (1):

$$\lambda = 4L/n (n=1,3,5,\ldots) \quad (1)$$

The product of the resonance frequency f and the wavelength γ is the velocity of light, such that $$f \times \lambda = C \quad (2)$$

(C being the velocity of light through a substance having a specific inductive capacity $\varepsilon r$)

$$= CO/\sqrt{(\varepsilon r)}$$

where CO is the velocity of light in vacuum, and is given by $$CO = 1/\sqrt{(\in O \times \mu O)} \quad (3)$$

where $\in O$ and $\mu O$ stand for the specific inductive capacity and the magnetic permeability of vacuum, respectively.

Hence, the resonance frequency f is given by the following equation (4):

$$f = n \times CO/(4 \times L \times \sqrt{\in r}) \quad (4)$$

In equation (4), n is a positive odd number (1, 3, 5, ...), CO is the velocity of light in vacuum, L is the stub length and $\in r$ is the specific inductive capacity.

FIG. 5 is a diagram explaining the above mentioned signal transmission path (differential transmission path). In FIG. 5, backplane connectors 54A and 54B correspond to the connectors 23A, and 23B of FIG. 2A, respectively. In FIG. 5, a connector terminal 53A corresponds to a connector terminal of the connector 23A connected to the through-hole of the daughter card 21A of FIG. 2A. and a connector terminal 55A corresponds to a connector terminal of the connector 23A connected to the through-hole of the backplane 24 of FIG. 2A. In FIG. 5, a connector terminal 55B corresponds to a connector terminal of the connector 23B connected to the through-hole of the backplane 24 of FIG. 2A. A connector terminal 53B corresponds to a connector terminal of the connector 23B connected to the through-hole of the daughter card 21B of FIG. 2A.

A signal differentially output from an output buffer 51 (an output buffer, not shown, in the IC 22A of FIG. 2A) is delivered to the connector terminals 53A of the backplane connector 54A via wirings 52A in a daughter card (corresponding to the board 21A of FIG. 2A, for example), the connector terminals 55A of the backplane connector 54A, wirings 56 in the backplane (corresponding to the signal layer 44 of FIG. 4, for example), the connector terminals 55B of the backplane connector 54B, the connector terminals 53B of the backplane connector 54B and via wirings 52B in a daughter card (corresponding to the board 21B of FIG. 2A, for example) differentially to an input buffer 57 (an input buffer, not shown, provided in the IC 22B of FIG. 2A). The input buffer 57 includes a termination resistor between differential inputs. The differential input signal is supplied to an equalizer circuit and equalized.

A signal received from a connector via a wiring is deteriorated in a manner as detailed with reference to FIG. 4, under the effect of a reflected wave generated at an open end of a stub parasitically produced within a through-hole provided in a backplane. There occurs energy distribution into an energy passing from the branch point in the through-hole into the through-hole and an energy passing through a board (a signal layer in a daughter card or in a backplane). The energy passing through the through-hole is reflected at an end of the through-hole (open stub end). There occurs at the branch point in the through-hole further reflection of the reflected wave, and here multi-reflection occurs. Hence, a quarter-wavelength resonance occurs by a standing wave having an end of the connector terminal as an anti-node and the branch point in the through-hole as a node.

An insertion loss in a differential through-hole of FIG. 7 shows the results of an analysis of a through-hole structure (differential through-hole) of FIG. 6, in order to demonstrate above mentioned phenomena. In FIG. 7, the abscissa is a frequency and the ordinate is an input differential insertion loss Sdd21 (unit in dB). In the example of FIG. 7, the input differential insertion loss Sdd21 is of about −24 dB, in the vicinity of 7 GHz (maximum absolute value of the insertion loss (attenuation)), due to the quarter-wavelength resonance in the through-hole stub.

In FIG. 6, a backplane connector terminal pair 67, differentially transmitting a signal, is connected to a signal through-hole pair 62. The signal through-hole pair 62 is connected, in the signal layer disposed between GND layers 64, to a signal wiring pair 65. In FIG. 6, a stub (through-hole stub) 66 is a section between an open end at a bottom end of the signal through-hole 62 and a connection portion of the signal through-hole 62 and the signal wiring 65.

With a speed up of a line interface, a transmission rate not less than 10 Gbps is required on the backplane. Due to the through-hole characteristic described above, it may be understood that transmission is difficult.

Several literatures to solve this problem are known. However, they have respectively certain drawbacks.

Patent Literature 1 discloses a circuit board in which at least part of a through-hole and a via is drilled to reduce length of an electrically conductive stub of the hole, wherein the drilled part of the hole includes a transitioning portion from a first profile to a second profile to reduce reflection from the drilled hole end portion. The technique disclosed cuts the stub of the through-hole by drilling to reduce resonance caused by the stub. The technique is good in characteristic. However the drilling is difficult to control during board fabrication and there is concern about high costs due to the problem of yield or the like. Moreover, quality-related problems caused by residual burrs in cutting process by drilling have not yet been solved.

To address a problem that in high speed transmission of a signal on a differential wiring, waveform distortion occurs due to impedance mismatch, in a via-hole with an open stub, thus producing the jitter, Patent Literature 2 discloses a configuration in which the degree of coupling of the differential wiring is reduced, with a differential characteristic impedance remaining constant. That is, there is disclosed a technique in which the degree of coupling of the differential wiring is optimized to reduce an adverse effect caused by the through-hole stub. The technique presupposes that deterioration by a stub occurs at a frequency range sufficiently higher than an operating range and that the signal in the frequency range lower than the operating range is to be stabilized. In short, the technique disclosed is not able to compensate for the deterioration characteristic proper to the stub. There is not disclosed such a technique that overcomes limitations in the case where the signal frequency range is approximately the same as the frequency range of deterioration produced by the stub.

Patent Literature 3 discloses a method which optimizes a via structure to improve a high frequency performance of a backplane, and a method which optimizes a size as well as a shape of the via structure to improve its high frequency integrity performance. In FIG. 2 of the Patent Literature 3, an electrically conductive portion of a via composing a stub section is removed by drilling to remove a non-used stub portion of a plated through-hole (PTH). This leads to a problem of complicated designing. Moreover, problems of cost as well as quality due to back-drilling are not solved.

Patent Literature 4 discloses a configuration in which an integrated circuit includes an enclosed termination resistor designed to match to a characteristic impedance of a transmission line (signal source impedance), and in which the signal source drives a plurality of IC devices on a printed circuit board. The IC devices are cascade-connected in a chain, and internal resistors of the IC devices except the last IC device in the chain are bypassed by a short circuit underneath the IC devices, with the internal resistor of the last IC device in the chain not having a short circuit underneath it. Although a technique of providing the termination resistor within the IC device to increase the bus speed is disclosed, the technique does not solve the problem of deterioration in the through-hole characteristic brought about by a stub.

Patent Literature 1:
Japanese Patent Kohyo Publication No. JP2010-537402A
Patent Literature 2:
Japanese Patent Kokai Publication No. JP2007-142307A
Patent Literature 3:
Japanese Patent Kohyo Publication No. JP2006-526883A
Patent Literature 4:
Japanese Patent Kohyo Publication No. JP2002-530001A

SUMMARY

The following analysis is given by the present invention.

In the related techniques, there is not shown a technique which is capable of performing backplane transmission at a rate of, for example, 10 Gbps or higher, without undergoing a manufacturing constraint or the like of a circuit board.

An object of the present invention invented in view of the above problems of the related techniques, is to provide a system and a method capable of speeding up signal transmission and assuring a stable operation, without undergoing a manufacturing constraint or the like of a circuit board.

According to the present invention, there is provided a transmission system in which an AC termination circuit including a resistor and a capacitor is connected to an open end of a stub of a through-hole provided in a circuit board.

According to the present invention, there is also provided a method for constructing a backplane system comprising connecting an AC termination circuit including a resistor and a capacitor, to an open end of a stub of a through-hole formed in a circuit board.

According to the present invention, signal transmission may be performed in stability at a high speed without suffering from manufacturing limitations of a circuit board including a through-hole.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 15A, FIG. 15B and FIG. 15C are waveform diagrams illustrating signal propagation on the characteristic of FIG. 13.

PREFERRED MODES

According to the present invention, there is provided a technique which implements enables a signal transmission in a backplane or a midplane, used in a communication equipment, such as a router, a switch or a switching unit, or in an information processing equipment, such as a server or a storage to be speed up and operated in stability.

Figure 9:
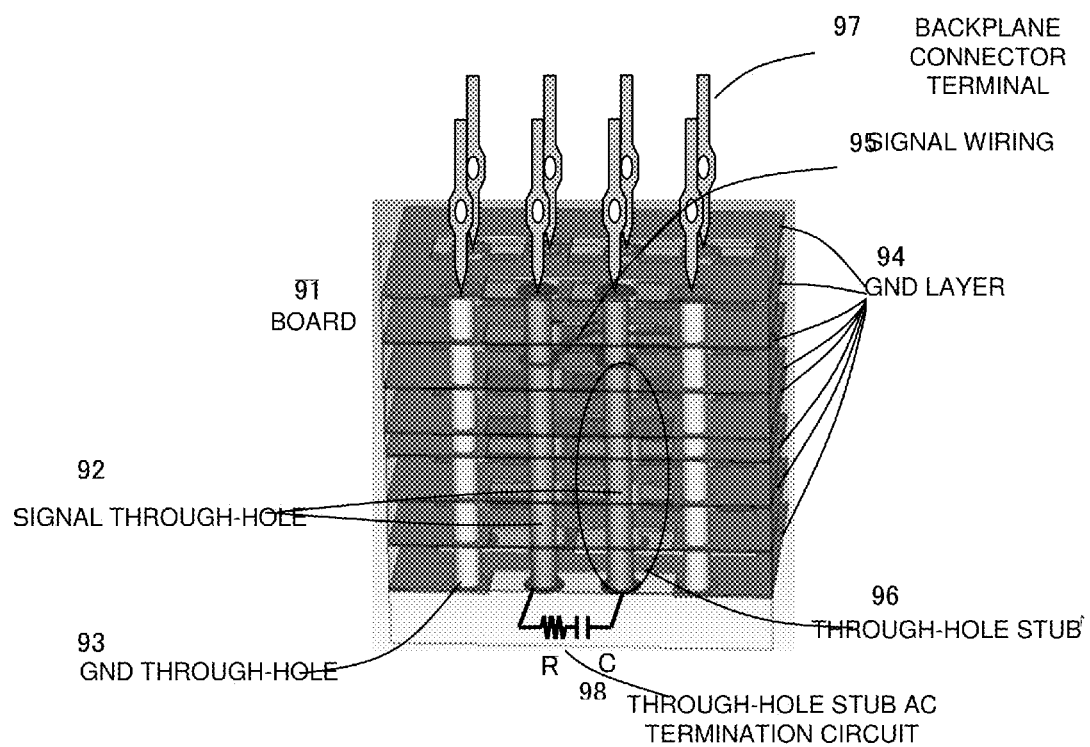
FIG. 9 is a cross-sectional diagram illustrating example installation of a first exemplary embodiment of the present invention.

In several preferred modes, an AC termination circuit (through-hole stub AC termination circuit 98) including a resistor (R) and a capacitor (C) is connected to an open end of a stub (96) of a through-hole (92) provided in a circuit board (91 of FIG. 9).

In several preferred modes, the through-hole includes a through-hole pair (92 of FIG. 9) configured to differentially transmit a signal. A connector terminal pair (97 of FIG. 9) is inserted into the through-hole pair (92) from a side of one surface of the circuit board (91 of FIG. 9). The AC termination circuit (98 of FIG. 9), including a series circuit of a resistor and a capacitor, is connected across the through-hole pair (92) on a surface on an opposite side to the one surface of the circuit board.

In several preferred modes, the through-hole(s) includes a through-hole pair configured to differentially transmit a signal. First and second connector terminals are respectively inserted into the first and second through-holes from a side of one surface of the circuit board. The AC termination circuits, each including a series circuit of a resistor and a capacitor, are connected on a surface on an opposite side to the one surface of the circuit board across the first through-hole and the ground and between the second through-hole and the ground.

In several preferred modes, the circuit board is either a backplane or a midplane.

In several preferred modes, the circuit board is a backplane, and the first as well as the second connector terminals includes backplane connector terminals (97 of FIG. 9) connected to the pair through-holes of the backplane.

In several preferred modes, the AC termination circuits (89A, 89B of FIG. 8), each including a resistor and a capacitor, may each be connected to an open end of a stub of a through-hole provided in a daughter card installed on the backplane by the backplane connector. The daughter card may include first and second through-holes configured to differentially transmit a signal. Connector terminals of the backplane connector may be inserted from a side of one surface of the daughter card into the first and second through-holes. The AC termination circuits (89A, 89B of FIG. 8), each including a series circuit of a resistor and a capacitor, may each be connected across the first and second through-holes on a surface on an opposite side to the one surface of the daughter card.

In several preferred modes, the daughter card may include first and second through-holes configured to differentially transmit a signal. Connector terminals of the backplane connector may be inserted from a side of one surface of the daughter card into the first and second through-holes. On a side opposite to the one surface of the daughter card, the AC termination circuits (89A, 89B of FIG. 17), each including a series circuit of a resistor and a capacitor, may each be connected between the first through-hole of the daughter card and the ground and across the second through-hole of the daughter card and the ground.

Figure 1:
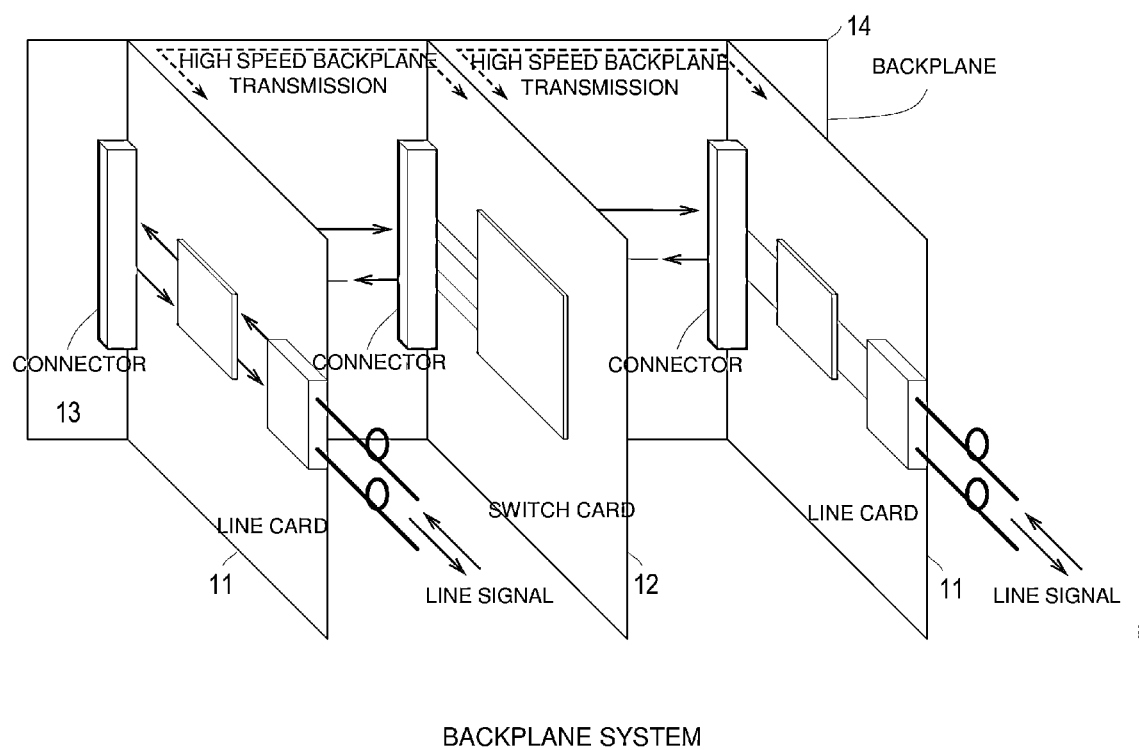
FIG. 1 is a schematic diagram illustrating an example (prototype) of a backplane system.
Figure 2A:
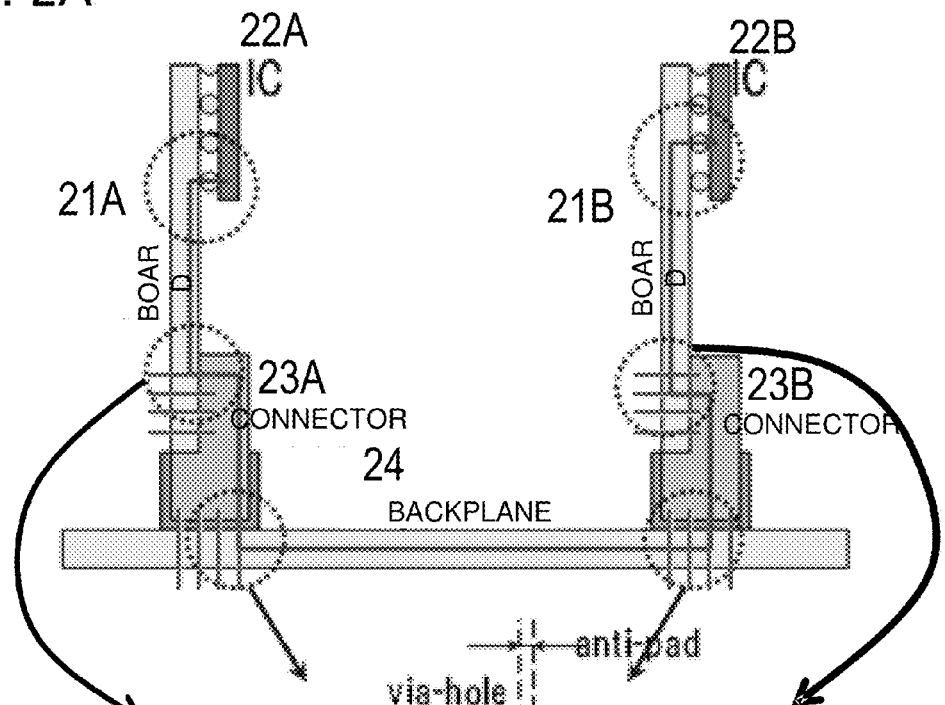
FIG. 2A is a side view of a backplane system.
Figure 2B:
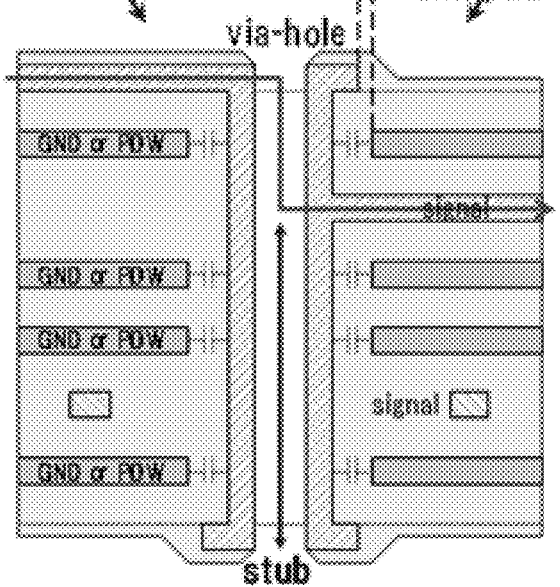
FIG. 2B is a schematic cross-sectional diagram illustrating a board through-hole.
Figure 3:
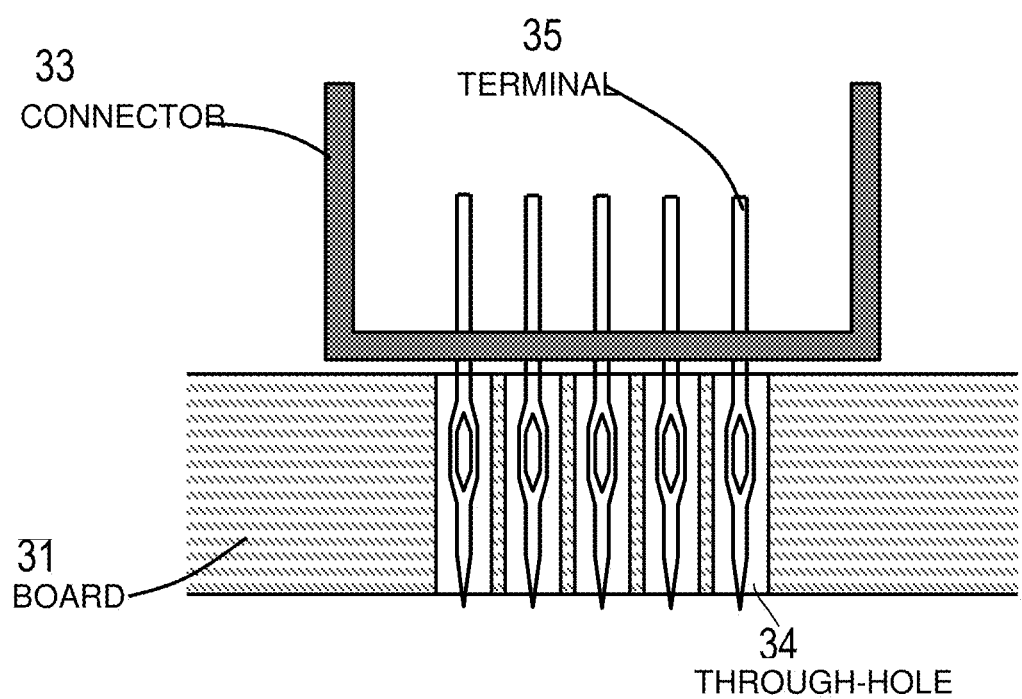
FIG. 3 is a schematic cross-sectional diagram illustrating a connector/daughter card connection configuration and a connector/backplane connection configuration.

Alternatively, in one of preferred modes, the transmission system may comprise: a first semiconductor chip (22A of FIG. 2A) including an output buffer (81 of FIG. 8) configured to differentially output a signal;
a first daughter card (21A of FIG. 2A) carrying thereon and connected to the first semiconductor chip;
a first backplane connector (23A of FIG. 2, 84A of FIG. 8) to mount the first daughter card on the backplane;
a second semiconductor chip (22B of FIG. 2A) including an input buffer (87 of FIG. 8) configured to differentially input a signal;
a second daughter card (21B of FIG. 2A) carrying thereon and connected to the second semiconductor chip;
a second backplane connector (23B of FIGS. 2 and 84B of FIG. 8) to mount the second daughter card on the backplane; and
a backplane (24 of FIG. 24A) including the circuit board.

The AC termination circuit may include first and second AC termination circuits (88A, 88B of FIG. 8) each including a series circuit of a resistor and a capacitor.

First and second connector terminals (85A) of the first backplane connector (23A of FIG. 2 and 84A of FIG. 8) are respectively inserted from a side of one surface of the backplane into a through-hole pair (first and second through-holes) configured to differentially transmit a signal. The first AC termination circuit (88A) may be connected across the first and second through-holes on a surface on an opposite side to the one surface of the backplane. First and second connector terminals (85B) of the second backplane connector (23B of FIG. 2, 84B of FIG. 8) may be respectively inserted from a side of one surface of the backplane into another through-hole pair (third and fourth through-holes) differentially outputting a signal. The second AC termination circuit (88B) may be connected between the third and fourth through-holes on a surface on an opposite side to the one surface of the backplane.

Alternatively, in one of preferred modes, the AC termination circuit may include first to fourth AC termination circuits (88A, 88C, 88B, 88D of FIG. 17), each including a series circuit of a resistor and a capacitor.

First and second connector terminals (85A) of the first backplane connector (23A of FIG. 2 and 84A of FIG. 8) may be inserted from a side of one surface of the backplane into the first and second through-holes configured to differentially transmit a signal. On a side opposite to the one surface of the backplane, the first AC termination circuit (88A) may be connected between the first through-hole and the ground and the second AC termination circuit (88C) between the second through-hole and the ground. First and second connector terminals (85B) of the second backplane connector (23B of FIG. 2 and 84B of FIG. 8) may be inserted from a side of one surface of the backplane into the third and fourth through-holes configured to differentially transmit a signal. On a side opposite to the one surface of the backplane, the third AC termination circuit (88B) may be connected between the third through-hole and the ground, and the fourth AC termination circuit (88D) across the fourth through-hole and the ground. Certain preferred modes will now be explained.

First Exemplary Embodiment

Figure 5:
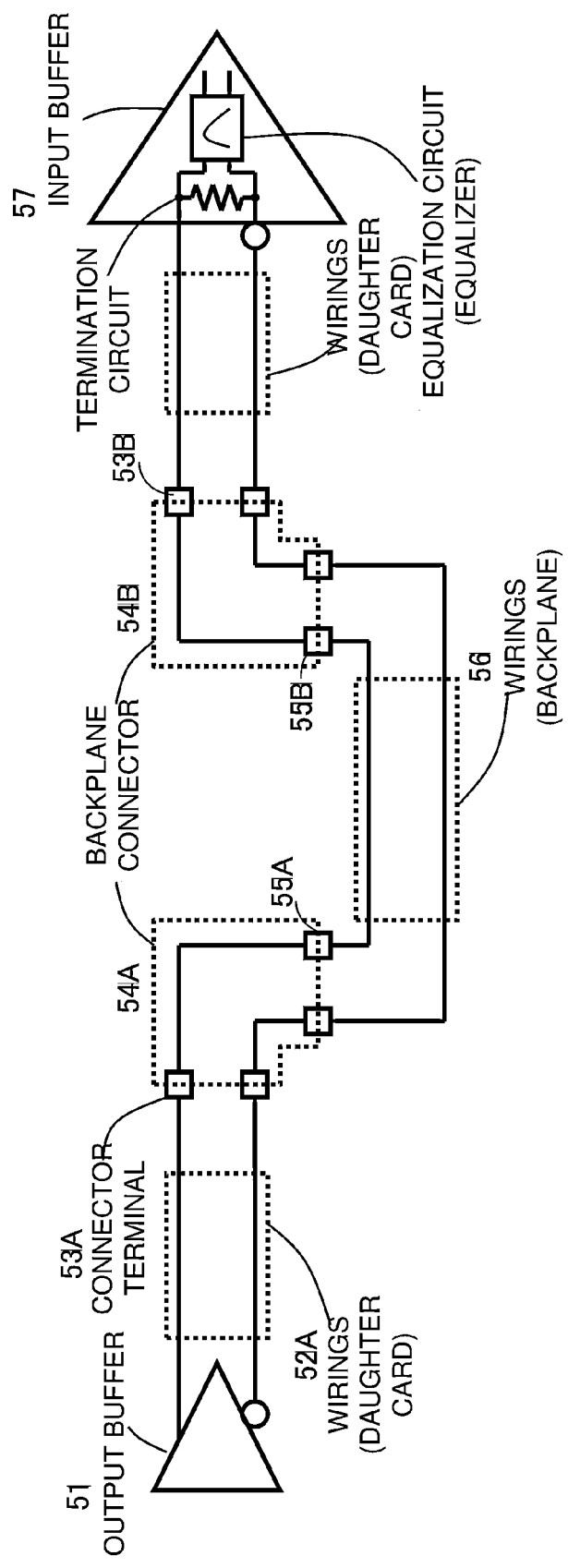
FIG. 5 is a circuit diagram illustrating a configuration of a differential transmission system.
Figure 8:
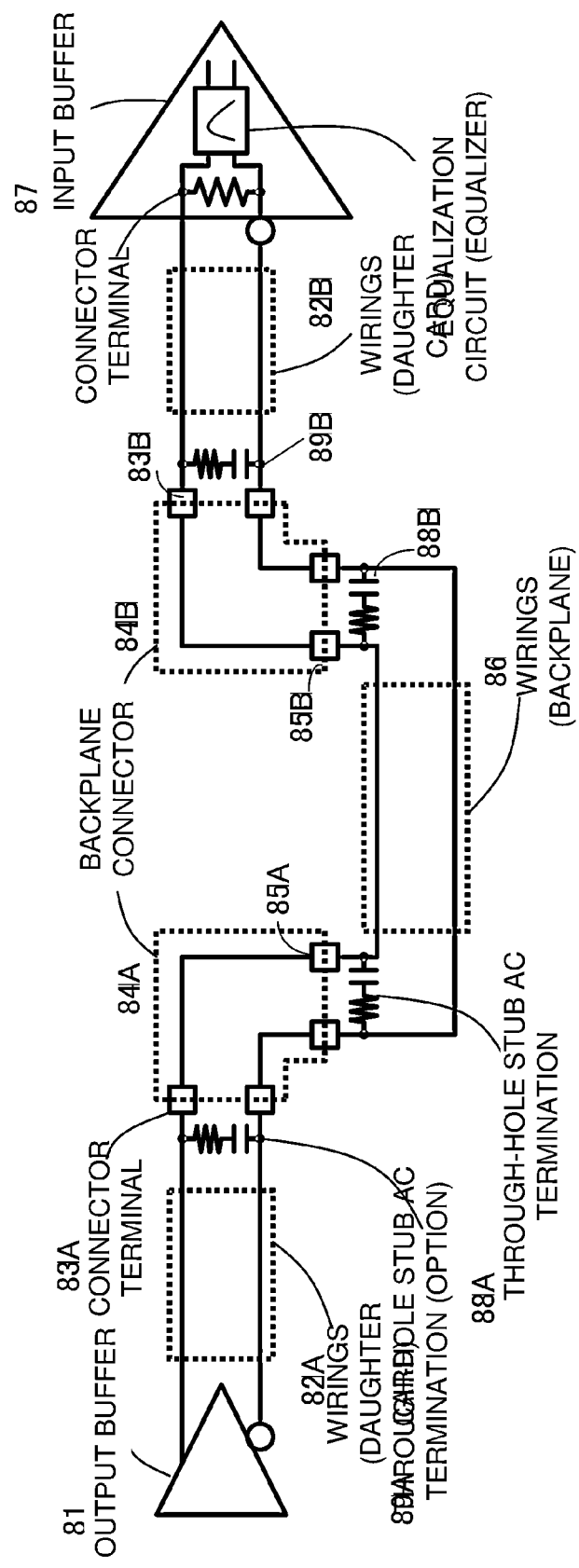
FIG. 8 is a circuit diagram illustrating a configuration of an exemplary embodiment 1 of the present invention.

FIG. 8 is a diagram illustrating a first exemplary embodiment. Contrasting the above described FIG. 5 with FIG. 8, in the present exemplary embodiment of FIG. 8, a through-hole stub AC termination circuit is provided in differential signal through-holes to which backplane connectors are connected. In high speed backplane transmission, a differential transmission circuit is used. Differential outputs of an output buffer 81 are coupled to connector terminals 83A of a backplane connector 84A by wirings 82A in a daughter card. Connector terminals 83B of a backplane connector 84B and differential inputs of an input buffer 87 are coupled together by wirings 82B in another daughter card. Connector terminals 85A and 85B of the backplane connectors 84A and 84B are connected by backplane wirings 86. In general, a characteristic impedance of differential wirings is of about 100 Ohms. The connector terminals 83A (83B) of the backplane connectors 84A (84B) are connected by press fit in the through-holes of the daughter cards. The connector terminals 85A (85B) of the backplane connectors 84A (84B) are connected by press fit in backplane through-holes.

Figure 4:
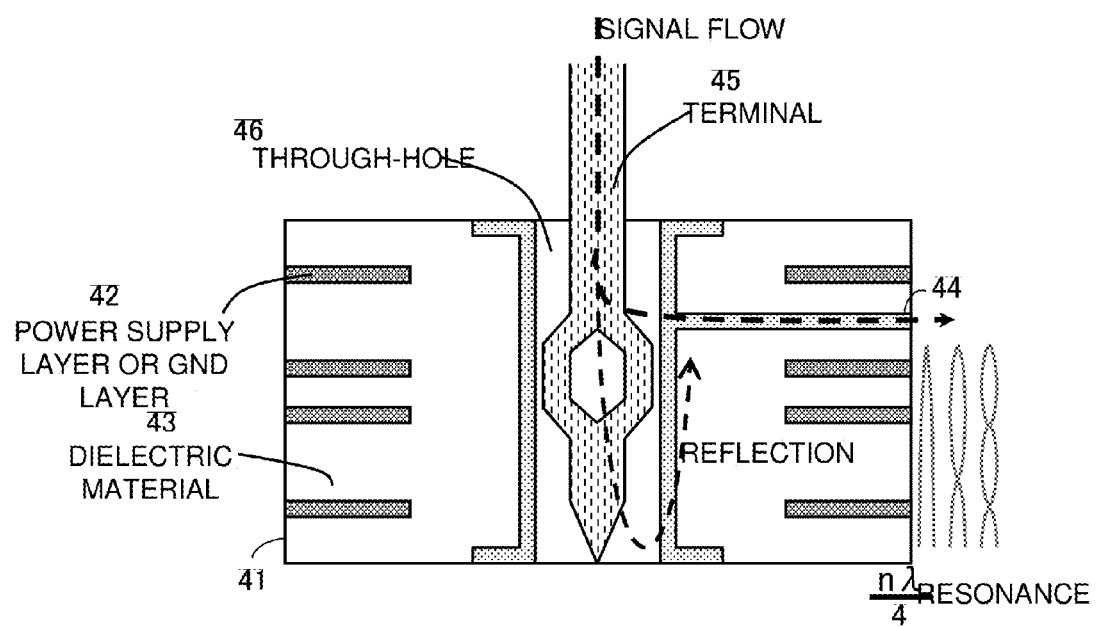
FIG. 4 is a schematic cross-sectional diagram illustrating a state of signal propagation in a connector and a board.

As described with reference to FIG. 4, a stub exists parasitically within each backplane through-hole. In the present exemplary embodiment, a through-hole stub AC termination circuit 88, including a resistor R and a capacitor C, is connected across differential signals on the site of the stub.

Figure 6:
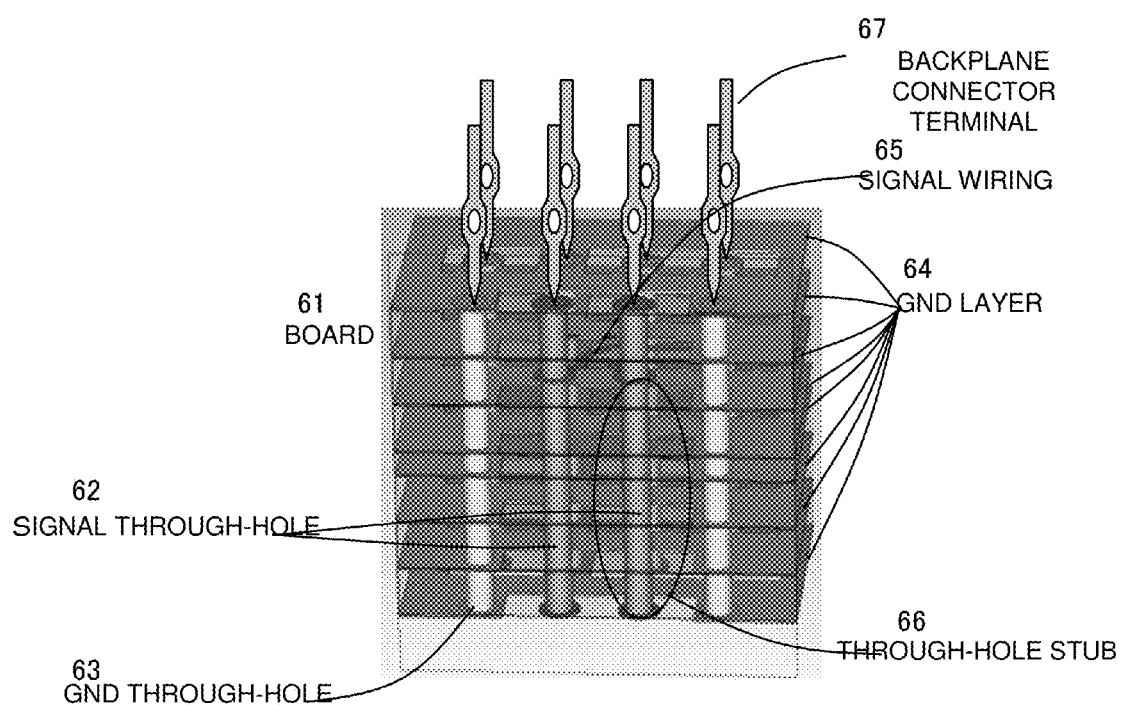
FIG. 6 is a schematic diagram illustrating connection between backplane connector terminals and through-holes.

FIG. 9 is a schematic diagram illustrating an image of installation of a through-hole stub AC termination circuit. The configuration of FIG. 9 is similar to the configuration of FIG. 6 except that a through-hole stub AC termination circuit 98 is connected at an open end of a stub in the configuration of FIG. 6. That is, the through-hole stub AC termination circuit 98 is installed on a surface of the board on an opposite side to a press-fit portion, as shown in FIG. 9. The connection of the through-hole stub AC termination circuits 89A and 89B (see FIG. 8) provided on the daughter card is optional. However, the through-hole stub AC termination circuits 89A and 89B are to be installed in the case wherein a resonance frequency as calculated by the equation (4) is within a signal operation range. It should be noticed that, since the board of the daughter card (see the boards 21A and 21B of FIG. 2A) is of a thin thickness in general, the through-hole is also shallow in depth, such that, in many cases, there is no marked effect of resonance ascribable to the stub.

Figure 7:
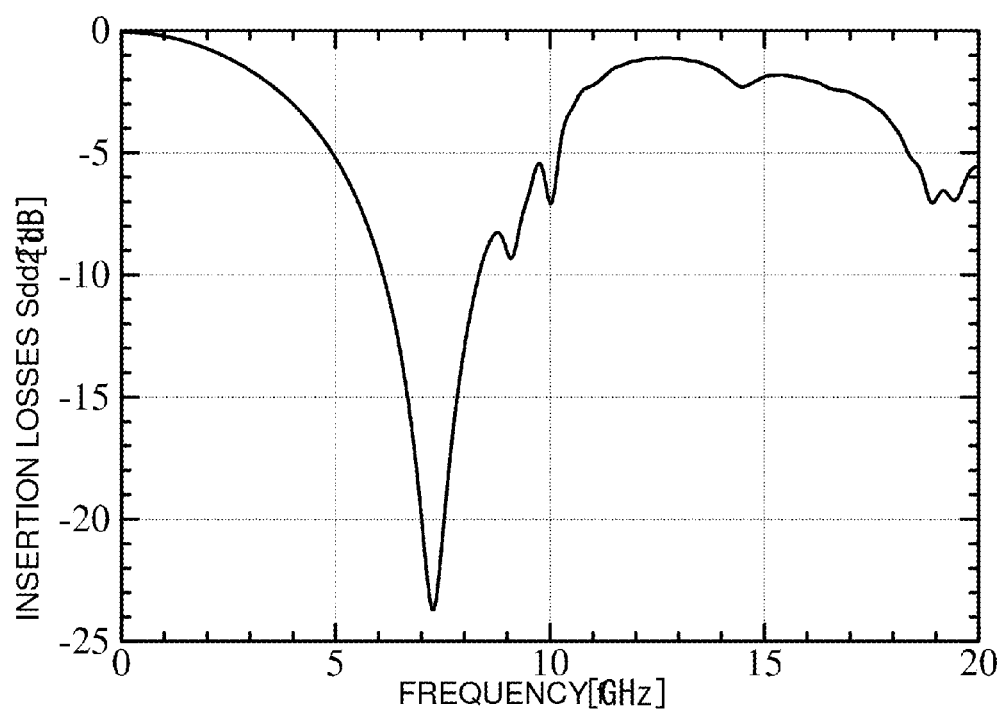
FIG. 7 is a graph illustrating a characteristic of differential through-hole insertion loss.

The following describes the operation of the transmission system of the present exemplary embodiment, shown in FIG. 8. In backplane transmission, a differential transmission circuit shown in FIG. 8 is used, and a signal is propagated along a path including: the output buffer 81→backplane connector 84A→wirings 86 (backplane)→backplane connector 84B→the input buffer 87. In high speed transmission of a rate of transmission equivalent to or exceeding 10 Gbps, the transmission waveform is attenuated due to an attenuation characteristic of a transmission line including wirings, connectors and through-holes. Moreover, parasitic stubs exist in connecting portions of a backplane connector, thus deteriorating the characteristic, as shown in FIG. 7. It is because resonance occurs between a branch point within the through-hole and its open end, as explained above with reference to FIG. 4.

Figure 10:
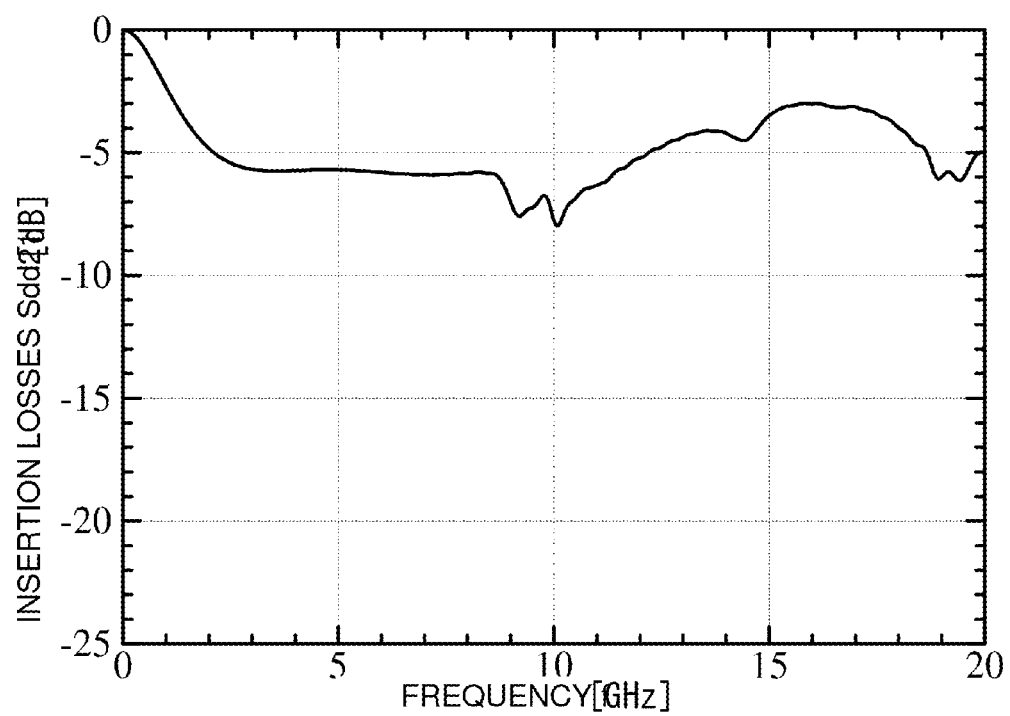
FIG. 10 is a graph illustrating a characteristic of differential through-hole insertion loss in the first exemplary embodiment.

By providing the through-hole stub AC termination circuit 98 at an open end of the stub, as shown in FIG. 9, it is possible to eliminate reflection at the open end of the through-hole to prevent deterioration otherwise caused by resonance. FIG. 10 shows a characteristic of the through-hole stub AC termination circuit 98. Originally, attenuation as much as −24 dB occurred in the vicinity of 7 GHz (see FIG. 7). By providing the through-hole stub AC termination 98 at the open end of a through-hole stub, as in the present exemplary embodiment, it is possible to suppress the attenuation to as low as −6 dB or so. A characteristic impedance of a differential transmission line is usually designed to b of about 100 Ohms, so that a resistance value is of about 100 Ohms of the through-hole stub AC termination is appropriate. Since it is common that the characteristic impedance of the through-hole becomes smaller than 100 Ohms, the resistance value of the through-hole stub AC termination may be correspondingly smaller. On the other hand, a reasonable capacitance value of the capacitor of the through-hole stub AC termination is of about several pFs (pico-Farads) and is effective to suppress the loss corresponding to DC components by the terminal resistor.

Figure 11:
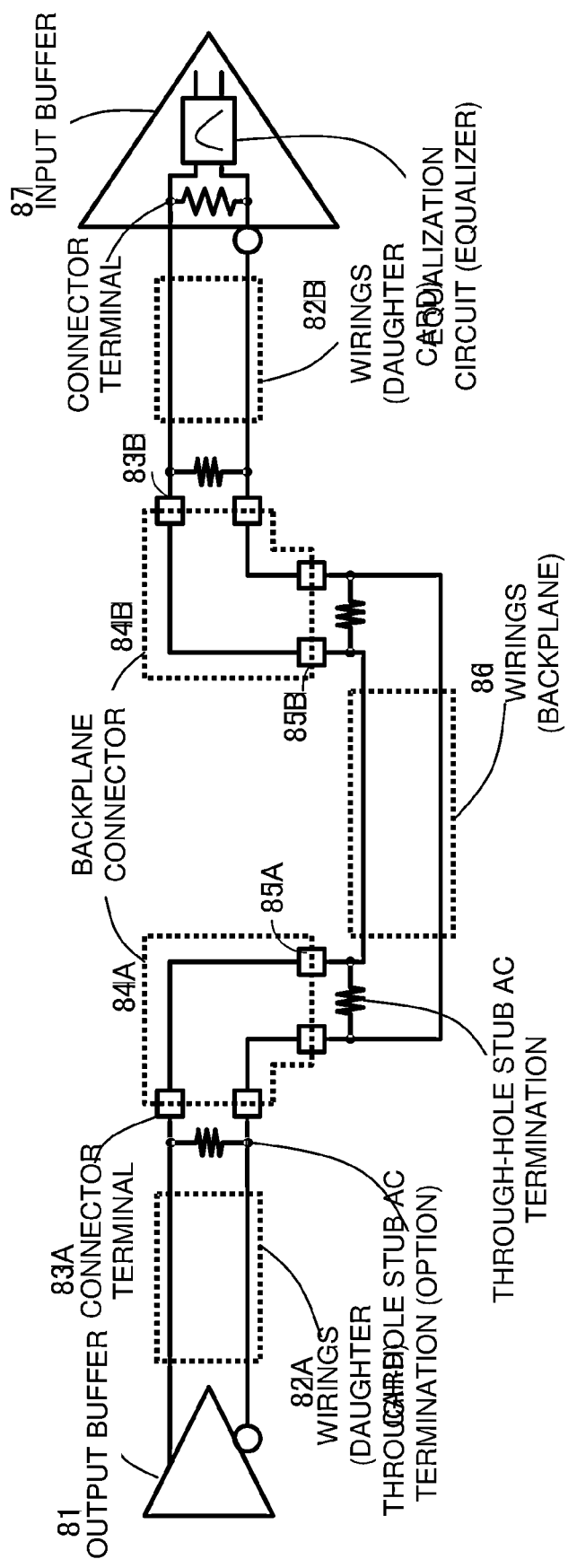
FIG. 11 is a circuit diagram illustrating a configuration of a reference Example.
Figure 12:
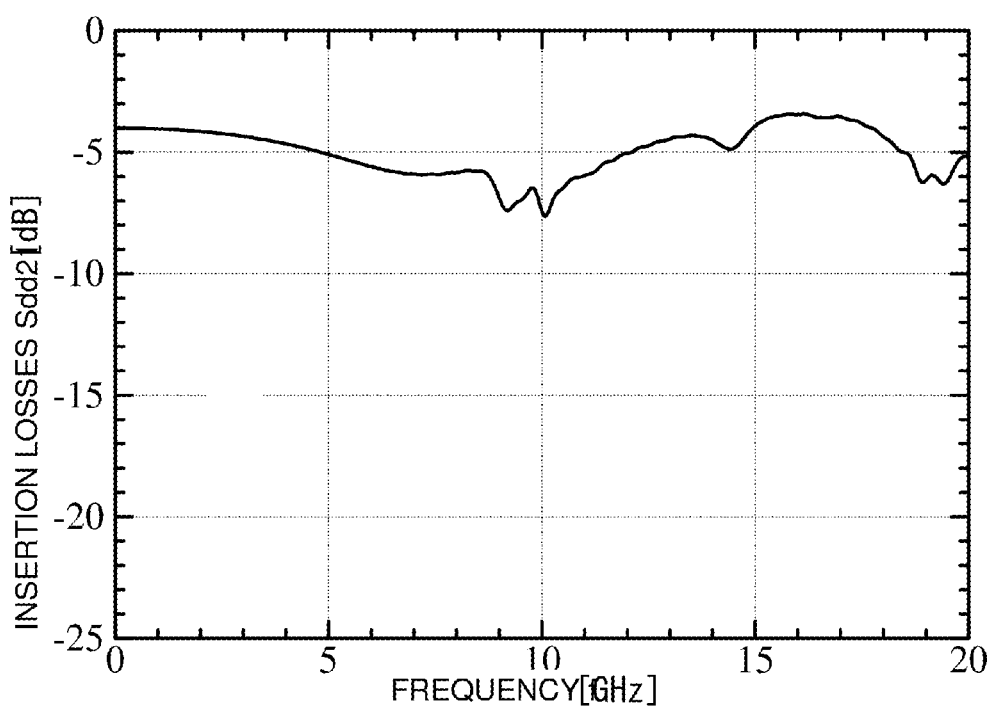
FIG. 12 is a graph illustrating a characteristic of differential through-hole insertion loss in the reference Example.

FIG. 11 is a diagram illustrating a configuration in which a through-hole stub AC termination composed by just a resistance with the exclusion of a capacitor, by way of a reference or comparative example. FIG. 12 shows a characteristic of a through-hole in the reference example of FIG. 11. It goes without saying that attenuation occurs in the low frequency range as well, in an amount corresponding to lack of the capacitor at the through-hole stub terminal, thus possibly causing inconveniences in transmission in the low frequency range.

Figure 13:
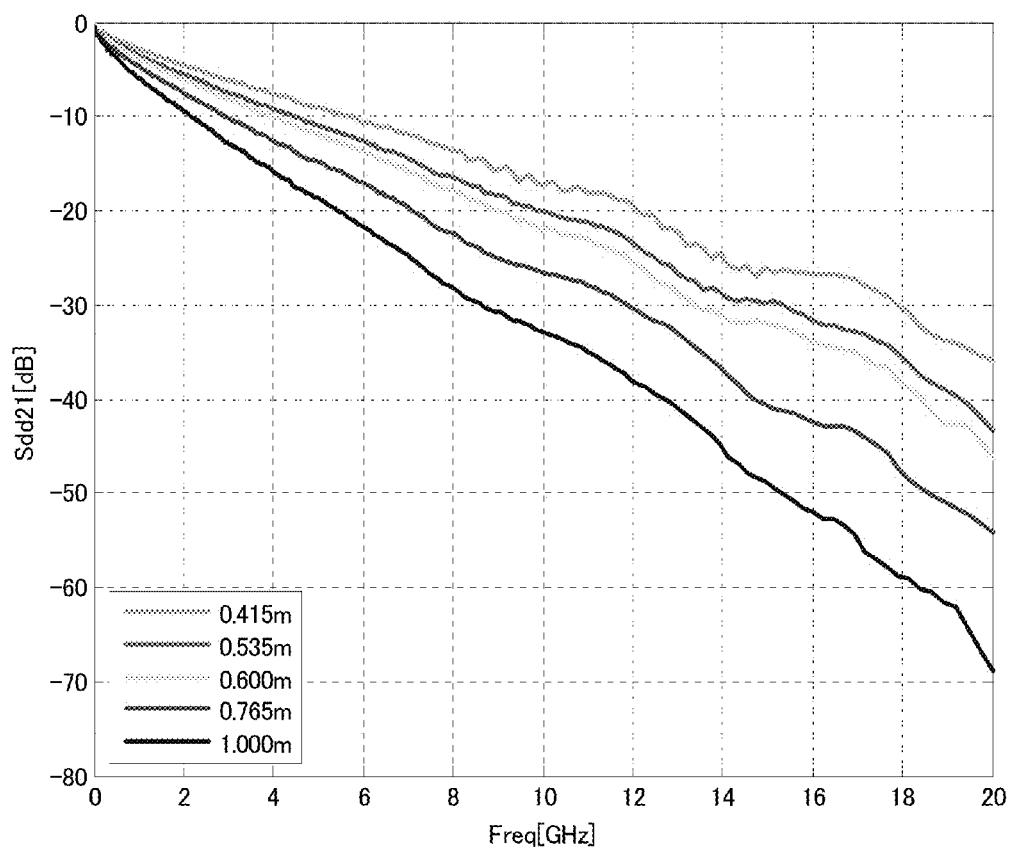
FIG. 13 is a graph illustrating a characteristic of a transmission line.
Figure 14:
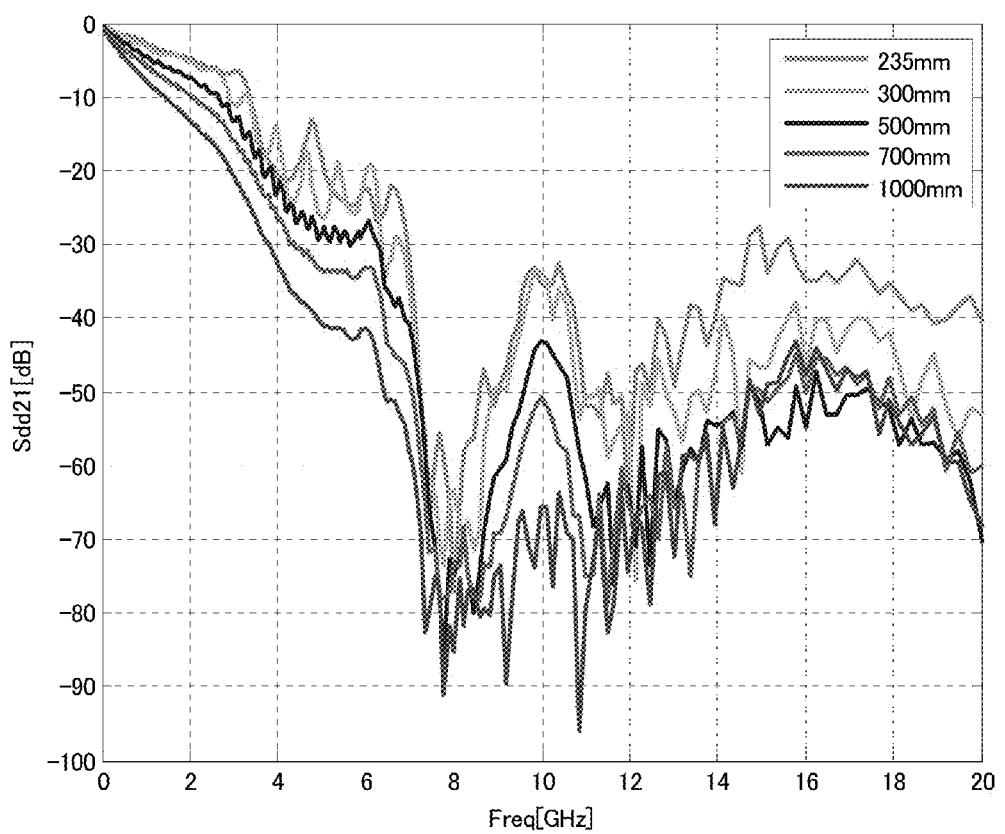
FIG. 14 is again a graph illustrating a characteristic of a transmission line.

In general, the characteristic of the transmission line including wirings, connectors and through-holes forms a curved having increasingly larger attenuation towards a higher frequency, as indicated in FIGS. 13 and 14. In the absence of resonance at the through-hole stub, the characteristic exhibits a profile evenly decreasing towards right, as indicated in FIG. 13. In FIG. 13, with an ordinate being a differential insertion loss Sdd21 and an abscissa being a frequency [GHz], characteristics for stub lengths equal to 0.415, 0.535, 0.600, 0.765 and 1.000 m are shown. When a stub resonance is present, the characteristics become irregular, as shown in FIG. 14.

On a transmission line, exhibiting a characteristic which evenly descends rightwards, as shown in FIG. 13, signal propagation occurs in such a manner that, as shown in FIG. 15, the greater the pulse width, the smaller becomes the attenuation, whereas, the smaller the pulse width, the greater becomes the attenuation.

Figure 16:
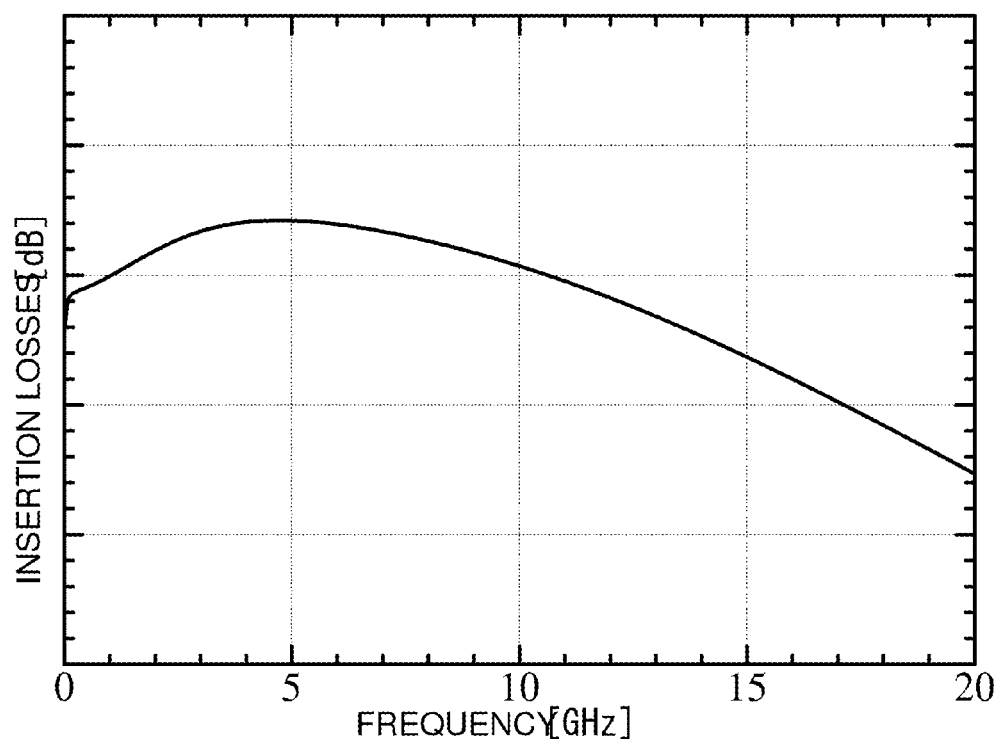
FIG. 16 is a graph illustrating a characteristic (insertion loss) of an equalizer circuit.

FIG. 16 shows an example characteristic (insertion loss) of an equalizer circuit of the input buffer 87. Referring to FIG. 16, the example characteristic is such a one that exhibits an upwardly convex characteristic (loss characteristic) having the Nyquist frequency of signal propagation as a peak in the vicinity of 5 GHz in FIG. 16, and that boosts the highest frequency component while gradually attenuating lower frequency components. By the characteristic of the equalizer circuit of the input buffer 87, a signal having a greater pulse width is purposely decreased in amplitude and a signal having a smaller pulse width is amplified to maintain a balance between low frequency components and high frequency components. By so doing, signal waveform shaping may be achieved such as to enable discrimination between 0 and 1 logic levels.

However, in the case of an irregular characteristic (such as one shown for example in FIG. 14, exhibiting stub resonance), a non-uniform waveform propagation is generated, in which the signal having a greater pulse width becomes smaller and the signal having a smaller pulse width becomes larger. Such signal is unable to be waveform-shaped by an equalizer circuit having a characteristic shown in FIG. 16.

According to the present exemplary embodiment, by applying AC termination with a resistor and a capacitor to an open end of a through-hole stub, it is possible to prevent resonance otherwise produced at the through-hole stub to implement stabilized backplane transmission.

Second Exemplary Embodiment

Figure 17:
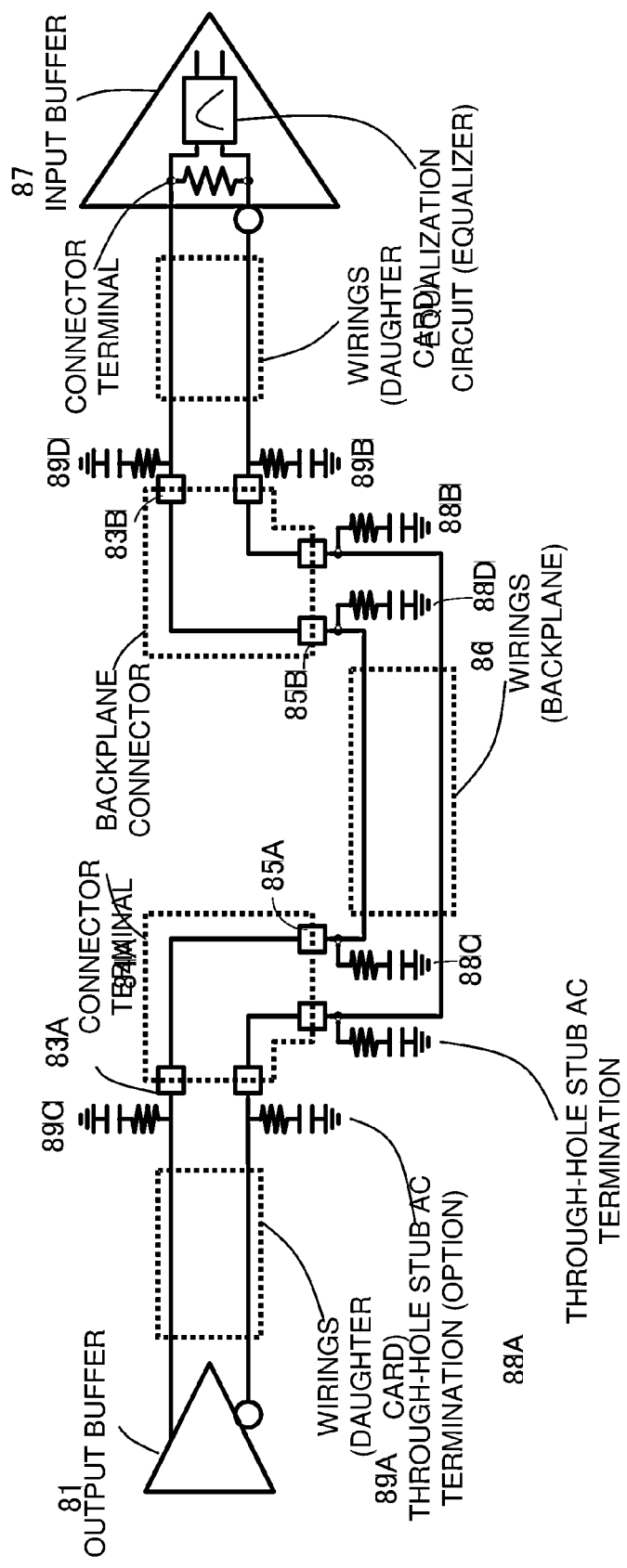
FIG. 17 is a circuit diagram illustrating the configuration of a second exemplary embodiment of the present invention.

FIG. 17 is a diagram illustrating an example of a through-hole stub AC termination according to another exemplary embodiment. In FIG. 8, AC termination is provided across differential signal lines. However, with an arrangement in which respective signals are AC terminated with respect to GND (ground), similar advantageous effects may be also obtained.

In the example of FIG. 8, AC termination is provided across differential signal lines by a through-hole stub AC termination circuit. In an example shown in FIG. 17, respective signals are AC terminated to GND. The first and second connector terminals 85A of the backplane connector 84A are inserted from one surface side of the backplane into first and second through-holes configured to differentially transmit a signal. On the surface on an opposite side to the one surface of the backplane, the first AC termination circuit 88A is connected between the first through-hole (open end of the through-hole stub) and the ground. The second AC termination circuit 88C is connected between the second through-hole (open end of the through-hole stub) and the ground. The first and second connector terminals 85B of the backplane connector 84B are inserted from one surface side of the backplane into third and fourth through-holes configured to differentially transmit a signal. On a surface opposite to the one surface of the backplane, the third AC termination circuit 88B is connected between the third through-hole (open end of the through-hole stub) and the ground. The fourth AC termination circuit 88D is connected between the fourth through-hole (open end of the through-hole stub) and the ground. A daughter card may also be provided with AC termination circuits 89A to 89D connected respectively between the open stub ends of the through-holes configured to differentially transmit a signal, and the ground. Such configuration may also lead to favorable results comparable to those of the above described exemplary embodiment 1.

In each of the exemplary embodiments, described above, a backplane system is taken as an example of the differential transmission system. However, the present invention may be equally applied to a differential transmission system including a midplane.

The above described exemplary embodiments may be applied to designing of communication equipment, such as routers, switches or switching units, information processing equipment, such as servers or storages, or electronic circuit boards.

The disclosure of the aforementioned Patent Publications is incorporated by reference herein. The particular exemplary embodiments or examples may be modified or adjusted within the scope of the entire disclosure of the present invention, inclusive of claims, based on the fundamental technical concept of the invention. In addition, a variety of combinations or selections of elements disclosed herein may be used within the concept of the claims. That is, the present invention may encompass a wide variety of modifications or corrections that may occur to those skilled in the art in accordance with the entire disclosure of the present invention, inclusive of claims and the technical concept of the present invention.

Part or all of the above described exemplary embodiments may be summarized as indicated in following additional items. It is observed that the following items are not to be understood to be limiting the invention.
(Supplementary Note 1)

A transmission system comprising an AC termination circuit connected to an open end of a stub of a through-hole(s) provided in a circuit board, the AC termination circuit including a resistor and a capacitor.
(Supplementary Note 2)

The transmission system according to Supplementary Note 1, wherein the through-hole(s) includes first and second through-holes configured to differentially transmit a signal;

first and second connector terminals being respectively inserted into the first and second through-holes from a side of one surface of the circuit board;

the AC termination circuit, including a series circuit of the resistor and the capacitor, being connected across the first and second through-holes on a surface on an opposite side to the one surface of the circuit board.
(Supplementary Note 3)

The transmission system according to Supplementary Note 1, wherein the through-hole(s) includes first and second through-holes configured to differentially transmit a signal, first and second connector terminals being respectively inserted into the first and second through-holes from a side of one surface of the circuit board;

the AC termination circuits, each including a series circuit of the resistor and the capacitor, being respectively connected on a surface on an opposite side to the one surface of the circuit board across the first through-hole and the ground and between the second through-hole and the ground.
(Supplementary Note 4)

The transmission system according to Supplementary Note 1, wherein the circuit board is a backplane or a midplane.
(Supplementary Note 5)

The transmission system according to Supplementary Note 2 or 3, wherein the circuit board is a backplane, the first and second connector terminals being connector terminals of a backplane connector connected to the first and second through-holes of the backplane.
(Supplementary Note 6)

The transmission system according to Supplementary Note 5, wherein the AC termination circuit including a series circuit of the resistor and the capacitor, is connected to an open end of a stub of a through-hole(s) provided in a daughter card installed on the backplane by the backplane connector.
(Supplementary Note 7)

The transmission system according to Supplementary Note 6, wherein the daughter card includes first and second through-holes configured to differentially transmit a signal, connector terminals of the backplane connector being inserted from a side of one surface of the daughter card into the first and second through-holes, the AC termination circuit including a series circuit of the resistor and the capacitor, being connected across the first and second through-holes of the daughter card on a surface on an opposite side to the one surface of the daughter card.
(Supplementary Note 8)

The transmission system according to Supplementary Note 6, wherein the daughter card includes first and second through-holes configured to differentially transmit a signal, connector terminals of the backplane connector being inserted from a side of one surface of the daughter card into the first and second through-holes, on a surface on an opposite side to the one surface of the daughter card, the AC termination circuits, each including a series circuit of the resistor and the capacitor, being connected between the first through-hole and a ground of the daughter card and across the second through-hole and the ground of the daughter card.
(Supplementary Note 9)

The transmission system according to Supplementary Note 1, comprising a first semiconductor chip including an output buffer configured to differentially output a signal;

a first daughter card carrying thereon and connected to the first semiconductor chip;

a first backplane connector to mount the first daughter card on the backplane;

a second semiconductor chip including an input buffer configured to differentially input a signal;

a second daughter card carrying thereon and connected to the second semiconductor chip;

a second backplane connector to mount the second daughter card on the backplane; and a backplane including the circuit board, wherein the AC termination circuit includes first and second AC termination circuits each including a series circuit of the resistor and the capacitor;

first and second connector terminals of the first backplane connector being respectively inserted from a side of one surface of the backplane into first and second through-holes configured to differentially transmit a signal, the first AC termination circuit being connected across the first and second through-holes on a surface on an opposite side to the one surface of the backplane, first and second connector terminals of the second backplane connector being respectively inserted from a side of one surface of the backplane into third and fourth through-holes differentially outputting a signal, the second AC termination circuit being connected between the third and fourth through-holes on a surface on an opposite side to the one surface of the backplane.

(Supplementary Note 10)

The transmission system according to Supplementary Note 1, comprising a first semiconductor chip including an output buffer configured to differentially output a signal;

a first daughter card carrying thereon and connected to the first semiconductor chip;

a first backplane connector to mount the first daughter card on the backplane;

a second semiconductor chip including an input buffer configured to differentially input a signal;

a second daughter card carrying thereon and connected to the second semiconductor chip;

a second backplane connector to mount the second daughter card on the backplane; and a backplane including the circuit board, wherein the AC termination circuit includes first to fourth AC termination circuits each including a series circuit of the resistor and the capacitor;

first and second connector terminals of the first backplane connector being inserted from a side of one surface of the backplane into first and second through-holes configured to differentially transmit a signal, on a surface on an opposite side to the one surface of the backplane, the first AC termination circuit being connected between the first through-hole and the ground; the second AC termination circuit being connected between the second through-hole and the ground, first and second connector terminals of the second backplane connector being inserted from a side of one surface of the backplane into third and fourth through-holes configured to differentially transmit a signal, on a surface on an opposite side to the one surface of the backplane, the third AC termination circuit being connected between the third through-hole and the ground and the fourth AC termination circuit being connected between the fourth through-hole and the ground.

(Supplementary Note 11)

A backplane system constructing method comprising connecting an AC termination circuit including a resistor and a capacitor to an open end of a stub of a through-hole(s) provided in a backplane.

(Supplementary Note 12)

The backplane system constructing method according to Supplementary Note 11, wherein the through-hole(s) include first and second through-holes configured to differentially transmit a signal; the method comprising respectively inserting first and second connector terminals of a backplane connector into the first and second through-holes from a side of one surface of the backplane; and connecting the AC termination circuit composed by the resistor and the capacitor across the first and second through-holes on a surface on an opposite side to the one surface of the backplane.

(Supplementary Note 13)

The backplane system constructing method according to Supplementary Note 11, wherein the through-hole(s) include first and second through-holes configured to differentially transmit a signal; the method comprising respectively inserting first and second connector terminals of a backplane connector into the first and second through-holes from a side of one surface of the backplane; and connecting, on a surface on an opposite side to the one surface of the backplane, the AC termination circuits each composed by the resistor and the capacitor across the first through-hole and the ground and between the second through-hole and the ground.

The invention claimed is:

1. A transmission system comprising
an equalizer with a frequency characteristic inverse to a transmission characteristic of a transmission line on which a signal is transmitted and from which the equalizer receives the signal, the equalizer performing waveform shaping of the signal received so as to allow for discrimination of a logical level of the signal by enlarging or reducing an amplitude of the signal in correspondence with a pulse width of the signal;
a circuit board constituting the transmission line; and
an AC termination circuit connected to an open end of a stub of a through-hole (s) provided in the circuit board, the AC termination circuit including a resistor and a capacitor, the AC termination circuit being adapted to suppress a resonant oscillation of the stub in the through-hole to prevent a non-uniform waveform propagation to the equalizer due to the resonant oscillation of the stub.

2. The transmission system according to claim 1, wherein the through-hole includes first and second through-holes configured to differentially transmit a signal, and the AC termination circuit includes a first AC termination circuit including a series circuit of a resistor and a capacitor, first and second connector terminals being respectively inserted into the first and second through-holes from a side of one surface of the circuit board, the first AC termination circuit being connected across the first and second through-holes on a surface on an opposite side to the one surface of the circuit board, the first AC termination circuit adapted to suppress a resonant oscillation of each of stubs in the first and second through-holes.

3. The transmission system according to claim 1, wherein the through-hole includes first and second through-holes configured to differentially transmit a signal, and the AC termination circuit includes first and second AC termination circuits, each including a series circuit of a resistor and a capacitor first and second connector terminals being respectively inserted into the first and second through-holes from a side of one surface of the circuit board, the first and second AC termination circuits being respectively connected between the first through-hole and a ground and between the second through-hole and the ground on a surface on an opposite side to the one surface of the circuit board, the first and second AC termination circuits respectively adapted to suppress resonant oscillations of stubs in the first and second through-holes.

4. The transmission system according to claim 2, further comprising, a backplane including the circuit board, the first and second connector terminals being connector terminals of a backplane connector connected to the first and second through-holes of the backplane.

5. The transmission system according to claim 4, wherein the AC termination circuit includes a third AC termination circuit including a series circuit of a resistor and a capacitor, the third AC termination circuit being connected to an open end of a stub of a through-hole provided in a daughter card installed on the backplane by the backplane connector, the third AC termination circuit being adapted to suppress a resonant oscillation of a stub in the through-hole provided in the daughter card.

6. A transmission system comprising:

a circuit board; and an AC termination circuit connected to an open end of a stub of a through-hole (s) provided in the circuit board, the AC termination circuit including a resistor and a capacitor, wherein the through-hole includes first and second through-holes configured to differentially transmit a signal, and the AC termination circuit includes first and second AC termination circuits, each including a series circuit of a resistor and a capacitor, wherein first and second connector terminals are respectively inserted into the first and second through-holes from a side of one surface of the circuit board, wherein the first and second AC termination circuits are respectively connected between the first through-hole and a ground and between the second through-hole and the ground on a surface on an opposite side to the one surface of the circuit board, wherein the circuit board is a backplane, wherein the first and second connector terminals are connector terminals of a backplane connector connected to the first and second through-holes of the backplane, wherein the AC termination circuit includes a third AC termination circuit including a series circuit of a resistor and a capacitor, wherein the third AC termination circuit being connected to an open end of a stub of a through-hole provided in a daughter card installed on the backplane by the backplane connector, wherein the daughter card includes first and second through-holes configured to differentially transmit a signal, connector terminals of the backplane connector being inserted from a side of one surface of the daughter card into the first and second through-holes, the third AC termination circuit including a series circuit of the resistor and the capacitor, being connected across the first and second through-holes on a surface on an opposite side to the one surface of the daughter card.

7. A transmission system comprising:

a circuit board; and an AC termination circuit connected to an open end of a stub of a through-hole(s) provided in the circuit board, the AC termination circuit including a resistor and a capacitor, wherein the through-hole includes first and second through-holes configured to differentially transmit a signal, and the AC termination circuit includes first and second AC termination circuits, each including a series circuit of a resistor and a capacitor, wherein first and second connector terminals are respectively inserted into the first and second through-holes from a side of one surface of the circuit board, wherein the first and second AC termination circuits are respectively connected between the first through-hole and a ground and between the second through-hole and the ground on a surface on an opposite side to the one surface of the circuit board, wherein the circuit board is a backplane, wherein the first and second connector terminals are connector terminals of a backplane connector connected to the first and second through-holes of the backplane, wherein the AC termination circuit includes a third AC termination circuit including a series circuit of a resistor and a capacitor, wherein the third AC termination circuit being connected to an open end of a stub of a through-hole provided in a daughter card installed on the backplane by the backplane connector, wherein the daughter card includes first and second through-holes configured to differentially transmit a signal, and the AC termination circuit includes further a fourth AC termination circuit including a series circuit of a resistor and a capacitor, connector terminals of the backplane connector being inserted from a side of one surface of the daughter card into the first and second through-holes, on a surface on an opposite side to the one surface of the daughter card, the third and fourth AC termination circuit being connected between the first through-hole and a ground of the daughter card, and between the second through-hole and the ground of the daughter card.

8. A transmission system comprising:

a circuit board;

an AC termination circuit connected to an open end of a stub of a through-hole (s) provided in the circuit board, the AC termination circuit including a resistor and a capacitor;

a backplane including the circuit board;

a first semiconductor chip including an output buffer configured to differentially output a signal;

a first daughter card carrying thereon and connected to the first semiconductor chip;

a first backplane connector to mount the first daughter card on the backplane;

a second semiconductor chip including an input buffer configured to differentially input a signal;

a second daughter card carrying thereon and connected to the second semiconductor chip; and a second backplane connector to mount the second daughter card on the backplane;

wherein
the AC termination circuit includes first and second AC termination circuits, each including a series circuit of a resistor and a capacitor,
first and second connector terminals of the first backplane connector being respectively inserted from a side of one surface of the backplane into the first and second through-holes configured to differentially transmit a signal,
the first AC termination circuit being connected across the first and second through-holes on a surface on an opposite side to the one surface of the backplane,
first and second connector terminals of the second backplane connector being respectively inserted from a side of one surface of the backplane into third and fourth through-holes configured to differentially output a signal, and
the second AC termination circuit being connected between the third and fourth through-holes on a surface on an opposite side to the one surface of the backplane.

9. A transmission system comprising:
a circuit board;
an AC termination circuit connected to an open end of a stub of a through-hole (s) provided in the circuit board, the AC termination circuit including a resistor and a capacitor;
a backplane including the circuit board;
a first semiconductor chip including an output buffer configured to differentially output a signal;
a first daughter card carrying thereon and connected to the first semiconductor chip;
a first backplane connector to mount the first daughter card on the backplane;
a second semiconductor chip including an input buffer configured to differentially input a signal;
a second daughter card carrying thereon and connected to the second semiconductor chip; and
a second backplane connector to mount the second daughter card on the backplane;
wherein
the AC termination circuit includes first to fourth AC termination circuits, each including a series circuit of a resistor and a capacitor;
first and second connector terminals of the first backplane connector being respectively inserted from a side of one surface of the backplane into first and second through-holes configured to differentially transmit a signal;
on a surface on an opposite side to the one surface of the backplane, the first AC termination circuit being connected between the first through-hole and a ground,
the second AC termination circuit being connected between the second through-hole and the ground,
first and second connector terminals of the second backplane connector being respectively inserted from a side of one surface of the backplane into third and fourth through-holes configured to differentially transmit a signal, and
on a surface on an opposite side to the one surface of the backplane, the third AC termination circuit being connected between the third through-hole and the ground, the fourth AC termination circuit being connected between the fourth through-hole and the ground.

10. A method for constructing a backplane system, the method comprising
connecting an AC termination circuit including a resistor and a capacitor, to an open end of a stub of a through-hole provided in a backplane, the through-hole constituting a part of a transmission line of a signal to an equalizer, the equalizer having a frequency characteristic inverse to a transmission characteristic of the transmission line from which the equalizer receives the signal,
performing waveform shaping of the signal received so as to allow for discrimination of a logical level of the signal by enlarging or reducing an amplitude of the signal in correspondence with a pulse width of the signal; and
suppressing, by the AC termination circuit, a resonant oscillation of the stub in the through-hole to prevent a non-uniform waveform propagation to the equalizer due to the resonant oscillation of the stub.

11. The method according to claim 10, wherein the through-hole includes first and second through-holes configured to differentially transmit a signal, and the AC termination circuit includes a first AC termination circuit including a series circuit of a resistor and a capacitor, the method further comprising,
inserting first and second connector terminals respectively into the first and second through-holes from a side of one surface of the circuit board, and connecting the first AC termination circuit across the first and second through-holes on a surface on an opposite side to the one surface of the circuit board, the first AC termination circuit suppressing a resonant oscillation of each of stubs in the first and second through-holes.

12. The method according to claim 10, wherein the through-hole includes first and second through-holes configured to differentially transmit a signal, and the AC termination circuit includes first and second AC termination circuits, each including a series circuit of a resistor and a capacitor, the method further comprising,
inserting first and second connector terminals respectively into the first and second through-holes from a side of one surface of the circuit board, and connecting the first and second AC termination circuits respectively between the first through-hole and a ground and between the second through-hole and the ground, on a surface on an opposite side to the one surface of the circuit board, the first and second AC termination circuit suppressing respectively resonant oscillations of stubs in the first and second through-holes.

13. The method according to claim 11, wherein the circuit board is a backplane, the first and second connector terminals being connector terminals of a backplane connector connected to the first and second through-holes of the backplane.

* * * * *